(12) United States Patent
Zhang et al.

(10) Patent No.: US 11,195,864 B2
(45) Date of Patent: Dec. 7, 2021

(54) FLIP-CHIP SAMPLE IMAGING DEVICES WITH SELF-ALIGNING LID

(71) Applicant: OmniVision Technologies, Inc., Santa Clara, CA (US)

(72) Inventors: Ming Zhang, Fremont, CA (US); Yin Qian, Milpitas, CA (US); Chia-Chun Miao, Sunnyvale, CA (US); Dyson H. Tai, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 97 days.

(21) Appl. No.: 16/290,832

(22) Filed: Mar. 1, 2019

(65) Prior Publication Data

US 2020/0279880 A1    Sep. 3, 2020

(51) Int. Cl.
    *H01L 27/146*    (2006.01)
(52) U.S. Cl.
    CPC .. *H01L 27/14603* (2013.01); *H01L 27/14609* (2013.01); *H01L 27/14636* (2013.01)
(58) Field of Classification Search
    CPC ............. H01L 25/167; H01L 27/14618; H01L 27/14603; H01L 27/14609; H01L 27/14636
    See application file for complete search history.

(56) References Cited

U.S. PATENT DOCUMENTS 5,699,073 A * 12/1997 Lebby .................. H01L 25/167
                                              345/82
2007/0111303 A1    5/2007  Inoue
2011/0096157 A1 *  4/2011  Fine ................... G02B 21/0008
                                              348/79
2013/0026591 A1 *  1/2013  Iwafuchi ........... H01L 27/14618
                                              257/432
2014/0084135 A1    3/2014  Chen et al.
2016/0116409 A1    4/2016  Massetti et al.

FOREIGN PATENT DOCUMENTS

TW         201413927 A      4/2014

OTHER PUBLICATIONS

Singh, et al. "A Hybrid CMOS-Microfluidic Contact Imaging Microsystem," IEEE Journal of Solid-State Circuits Nov. 2012; 47(11):2822-2833.
Wang, et al., "200 mm Wafer-Scale Integration of Sub-20 nm Sacrificial Nanofluidic Channels for Manipulating and Imaging Single DNA Molecules," Electron Devices Meeting (IEDM), IEEE International, pp. 14.1.1-14.1.4, 2013.

* cited by examiner

*Primary Examiner* — Latanya N Crawford Eason
(74) *Attorney, Agent, or Firm* — Lathrop GPM LLP

(57) ABSTRACT

A flip-chip sample imaging device with self-aligning lid includes an image sensor chip, a fan-out substrate, and a lid. The image sensor chip includes (a) a pixel array sensitive to light incident on a first side of the image sensor chip and (b) first electrical contacts disposed on the first side and electrically connected to the pixel array. The fan-out substrate is disposed on the first side, is electrically connected to the first electrical contacts, forms an aperture over the pixel array to partly define a sample chamber over the pixel array, and forms a first surface facing away from the first side. The lid is disposed on the first surface of the fan-out substrate, facing away from the first side, to further define the chamber. The lid includes an inner portion protruding into the aperture to align the lid relative to the fan-out substrate.

19 Claims, 6 Drawing Sheets

```
                                    1000
```

DISPOSE A FAN-OUT SUBSTRATE ON A FIRST SIDE OF AN IMAGE SENSOR CHIP INCLUDING A PIXEL ARRAY OF PHOTOSENSITIVE PIXELS SENSITIVE TO LIGHT INCIDENT ON THE FIRST SIDE, THE FAN-OUT SUBSTRATE FORMING AN APERTURE OVER THE PIXEL ARRAY TO PARTLY DEFINE A CHAMBER FOR HOLDING A FLUIDIC SAMPLE OVER THE PIXEL ARRAY
1010

COMPLETE ELECTRICAL CONNECTIONS BETWEEN FIRST ELECTRICAL CONTACTS OF THE IMAGE SENSOR CHIP AND SECOND ELECTRICAL CONTACTS ON A FIRST SURFACE OF THE FAN-OUT SUBSTRATE FACING THE FIRST SIDE
1012

SEAL THE FIRST SURFACE OF THE FAN-OUT SUBSTRATE TO THE FIRST SIDE OF THE IMAGE SENSOR CHIP
1020

ADHERE THE FIRST SURFACE TO THE FIRST SIDE
1022

ADD GLUE TO AN EXPOSED EDGE OF INTERFACE BETWEEN THE FIRST SURFACE AND THE FIRST SIDE TO ALLOW THE GLUE TO PROPAGATE ALONG THE INTERFACE VIA CAPILLARY ACTION
1024

SEAL A LID TO A SECOND SURFACE OF THE FAN-OUT SUBSTRATE FACING AWAY FROM THE FIRST SIDE, SUCH THAT AN INNER PORTION OF THE LID PROTRUDES INTO THE APERTURE TO (A) ALIGN THE LID RELATIVE TO THE FAN-OUT SUBSTRATE AND (B) FURTHER DEFINE THE CHAMBER
1030

SEAT THE INNER PORTION IN THE APERTURE TO ALIGN THE LID RELATIVE TO THE FAN-OUT SUBSTRATE
1032

ADHERE AN OUTER PORTION OF THE LID TO THE SECOND SURFACE
1034

FORM, ON A PORTION OF THE FIRST SURFACE THAT OVERHANGS THE IMAGE SENSOR CHIP AFTER THE STEP OF SEALING THE FIRST SURFACE TO THE FIRST SIDE, THIRD ELECTRICAL THAT ARE ELECTRICALLY CONNECTED TO THE SECOND ELECTRICAL CONTACTS VIA FAN-OUT CONNECTIONS OF THE FAN-OUT SUBSTRATE
1040

FIG. 10

FLIP-CHIP SAMPLE IMAGING DEVICES WITH SELF-ALIGNING LID

BACKGROUND

Imaging is commonly used as a sensing mechanism for evaluating biological samples. Traditionally, the biological sample is loaded into a fluidic device, e.g., a container or a microfluidic cartridge having a fluidic chamber or a more complex fluidic network. Next, at least a portion of the fluidic device is imaged by an imaging system to detect one or more analytes in the biological sample. Typically, an imaging objective, having one or more lenses, images the relevant portion or portions of the fluidic device onto an image sensor. However, lens-free imaging is gaining traction. Lens-free imaging systems may be significantly cheaper and also more compact than lens-based imaging systems. Most lens-free imaging systems position the sample very close to the image sensor, or even directly on the image sensor. The simplest lens-free imaging systems consist of an image sensor. Some lens-free imaging systems further include one or more additional components such as, a light source, one or more filters, and/or aperture. The reduced cost and size of lens-free imaging systems makes it feasible to integrate the imaging system (e.g., an image sensor) in a disposable fluidic device.

SUMMARY

In an embodiment, a flip-chip sample imaging device with self-aligning lid includes an image sensor chip, a fan-out substrate, and a lid. The image sensor chip includes (a) a pixel array of photosensitive pixels sensitive to light incident on a first side of the image sensor chip and (b) first electrical contacts disposed on the first side and electrically connected to the pixel array. The fan-out substrate (a) is disposed on the first side, (b) is electrically connected to the first electrical contacts, (c) forms an aperture over the pixel array to partly define a chamber for holding a fluid sample over the pixel array, and (d) forms a first surface facing away from the first side. The lid is disposed on the first surface of the fan-out substrate, facing away from the first side, to further define the chamber. The lid includes an inner portion protruding into the aperture to align the lid relative to the fan-out substrate in dimensions parallel to the first side.

In an embodiment, a method for manufacturing a flip-chip sample imaging device with self-aligning lid includes disposing a fan-out substrate on a first side of an image sensor chip including a pixel array of photosensitive pixels sensitive to light incident on the first side. The fan-out substrate forms an aperture over the pixel array partly defining a chamber for holding a fluidic sample over the pixel array. The step of disposing including completing electrical connections between first electrical contacts of the image sensor chip and second electrical contacts on a first surface of the fan-out substrate facing the first side. The method further includes sealing the first surface to the first side, and sealing a lid to a second surface of the fan-out substrate facing away from the first side, such that an inner portion of the lid protrudes into the aperture to (a) align the lid relative to the fan-out substrate and (b) further define the chamber.

BRIEF DESCRIPTION OF THE DRAWINGS

FIG. 10 illustrates a method for manufacturing a flip-chip sample imaging device with a self-aligning lid, according to an embodiment

DESCRIPTION OF EXAMPLE EMBODIMENTS

Figure 1A:
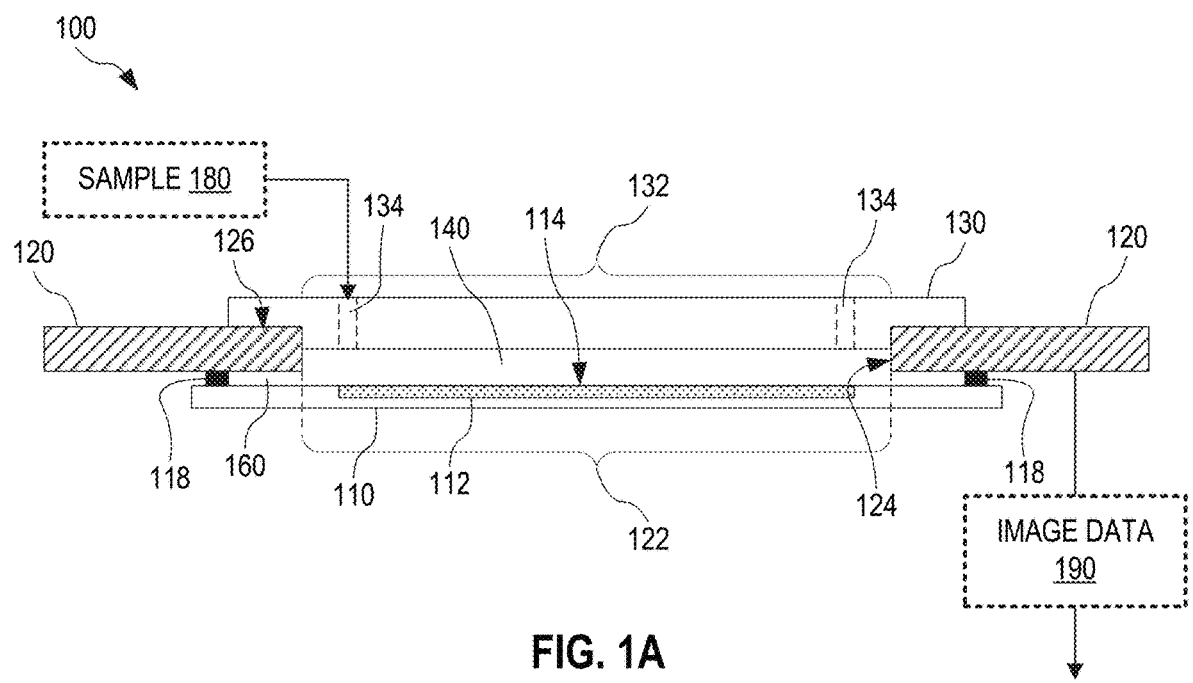
FIGS. 1A and 1B illustrate a flip-chip sample imaging device with a self-aligning lid, according to an embodiment.
Figure 1B:
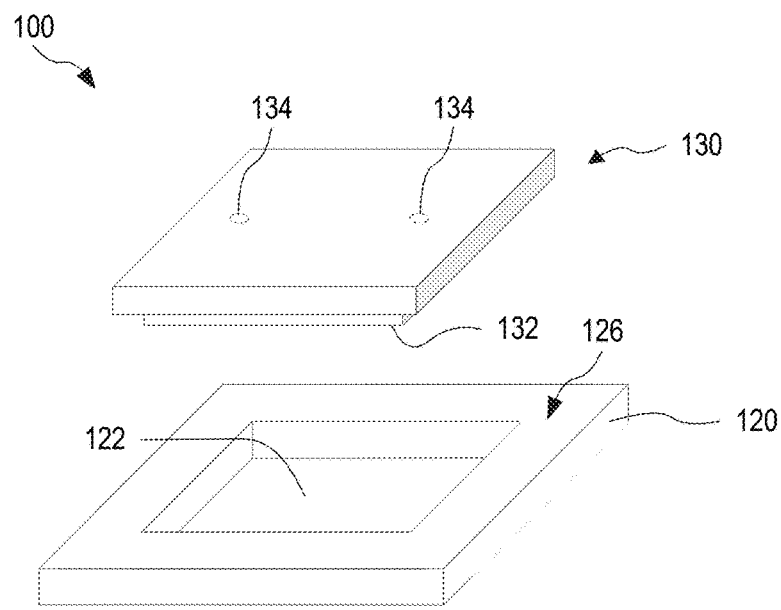

FIGS. 1A and 1B illustrate one flip-chip sample imaging device 100 with a self-aligning lid. Device 100 may be used for lens-free imaging of a sample 180 or an assay involving sample 180. Sample 180 may be a biological sample. FIG. 1A is a cross-sectional view of device 100, and FIG. 1B is an exploded view of device 100. FIGS. 1A and 1B are best viewed together in the following description. Device 100 includes image sensor chip 110, a fan-out substrate 120 disposed on image sensor chip 110, and a self-aligning lid 130 disposed on fan-out substrate 120.

Figure 1B:
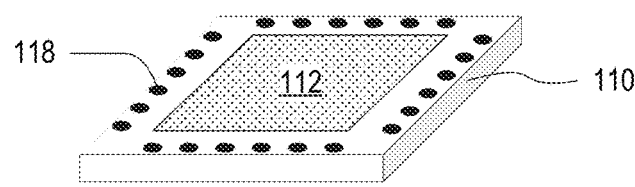

Image sensor chip 110 is a flip-chip image sensor that includes a pixel array 112 and a plurality of electrical contacts 118. Pixel array 112 includes a plurality of photosensitive pixels (not depicted in FIG. 1) that are sensitive to light incident on a side 114 of image sensor chip 110. Image sensor chip 110 may be a complementary metal-oxide-semiconductor (CMOS) image sensor chip. Electrical contacts 118 are disposed on side 114, peripheral to pixel array 112, and output electrical signals indicative of light detected by pixel array 112. Although not shown in FIGS. 1A and 1B, it is understood that electrical contacts 118 are communicatively coupled, directly or indirectly, to pixel array 112.

Fan-out substrate 120 is disposed on side 114 and has at least two functions: (a) redistribution of electrical signals received from image sensor chip 110 via electrical contacts 118, and (b) partial definition of a fluidic chamber 140 for housing sample 180 over pixel array 112. Fan-out substrate 120 is electrically connected to electrical contacts 118 and redistributes electrical signals received from image sensor chip 110 via electrical contacts 118. In operation, fan-out substrate 120 outputs image data 190 in the form of electrical signals received from electrical contacts 118 and, optionally, further processed by fan-out substrate 120. Fan-out substrate 120 forms an aperture 122. Side walls 124 of aperture 122 and side 114 of image sensor chip 110 cooperate to define fluidic chamber 140. Side walls 124 may be vertical, as indicated in FIGS. 1A and 1B, or be at an angle to vertical. The number and distribution of electrical contacts 118 peripherally to pixel array 112 may be different from what is shown in FIG. 1B, without departing from the scope hereof. Fan-out substrate 120 may be an organic substrate, with electrical connections and contacts made of metal.

FIG. 1A shows a gap 160 between fan-out substrate 120 and side 114 of image sensor chip 110. Without departing from the scope hereof, (a) the distance between fan-out substrate 120 and side 114 of image sensor chip 110 may be less than indicated in FIG. 1A and/or (b) gap 160 may be at least partly filled with, for example, an adhesive bonding fan-out substrate. In embodiments of device 100 having a non-zero gap 160, a portion of sample 180 may enter gap 160. However, sample 180 may be prevented from entering at least a portion of such a non-zero gap 160 by either one of the presence of trapped gas and relatively hydrophobic surface properties in gap 160.

Lid 130 is disposed on a surface 126 of fan-out substrate 120 that faces away from side 114 of image sensor chip 110. Lid 130 is sealed to fan-out substrate 120 to further define fluidic chamber 140. In one embodiment, lid 130 is glued to fan-out substrate 120. Lid 130 includes an inner portion 132 that protrudes into aperture 122 of fan-out substrate 120. When assembling lid 130 with fan-out substrate 120, inner portion 132 helps align the position of lid 130 to fan-out substrate 120. For comparison, with a planar lid, it is possible to accidentally misalign the lid relative to aperture 122 such that the lid does not cover aperture 122. For example, a planar lid may be misplaced offset from aperture 122 such that lid 130 fails to span over all of aperture 122, or the position of a planar lid may shift before or during bonding of the planar lid to fan-out substrate 120 to uncover a portion of aperture 122.

Lid may form one or more ports 134 to fluidic chamber 140. Ports 134 allow for addition of sample 180 to fluidic chamber 140. In one implementation, lid 130 includes two ports 134. In operation of this implementation, sample 180 is added to fluidic chamber 140 via a first port 134, while gas escapes from fluidic chamber 140 via a second port 134. Sample 180 may thus flow into fluidic chamber 140, for example to fill all of fluidic chamber 140 or a desired portion of fluidic chamber 140. This implementation of device 100 also allows for at least a portion of sample 180 to flow through fluidic chamber 140, after addition via the first port 134, and out of fluidic chamber 140 via the second port 134.

Without departing from the scope hereof, the upper side of lid 130, facing away from image sensor chip 110, may be non-planar. For example, one or more ports 134 may be associated with features that either protrude or are recessed from adjacent portions of the upper side of lid 130. Lid 130 may form ports 134 in positions different from those indicated in FIG. 1B.

In one embodiment, lid 130 is transparent and thus allows for light to penetrate through lid 130 to illuminate fluidic chamber 140 and aid imaging by image sensor chip 110. In this embodiment, lid 130 may be made of glass or a light transmissive plastic. In another embodiment, lid 130 is opaque and image sensor chip 110 images light generated within fluidic chamber 140, for example through the process of chemiluminescence.

Figure 2A:
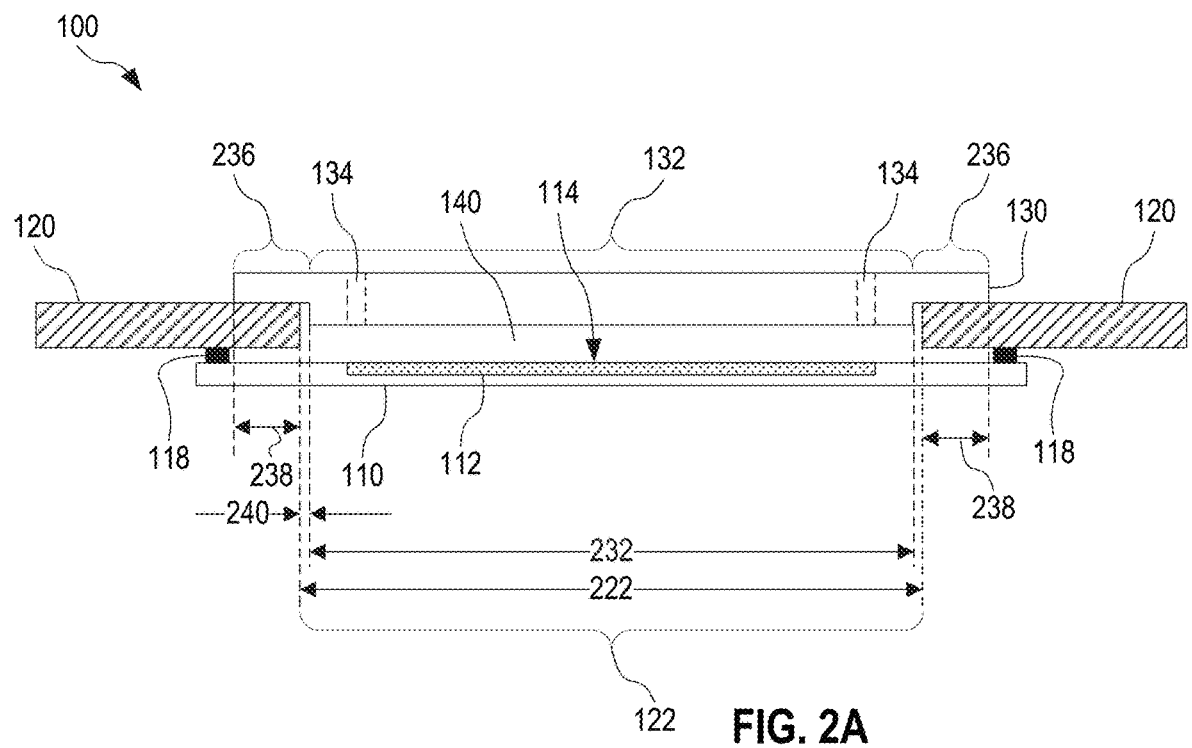
FIGS. 2A and 2B show the configuration of the self-aligning lid of the device of FIGS. 1A and 1B in further detail, according to an embodiment.
Figure 2B:
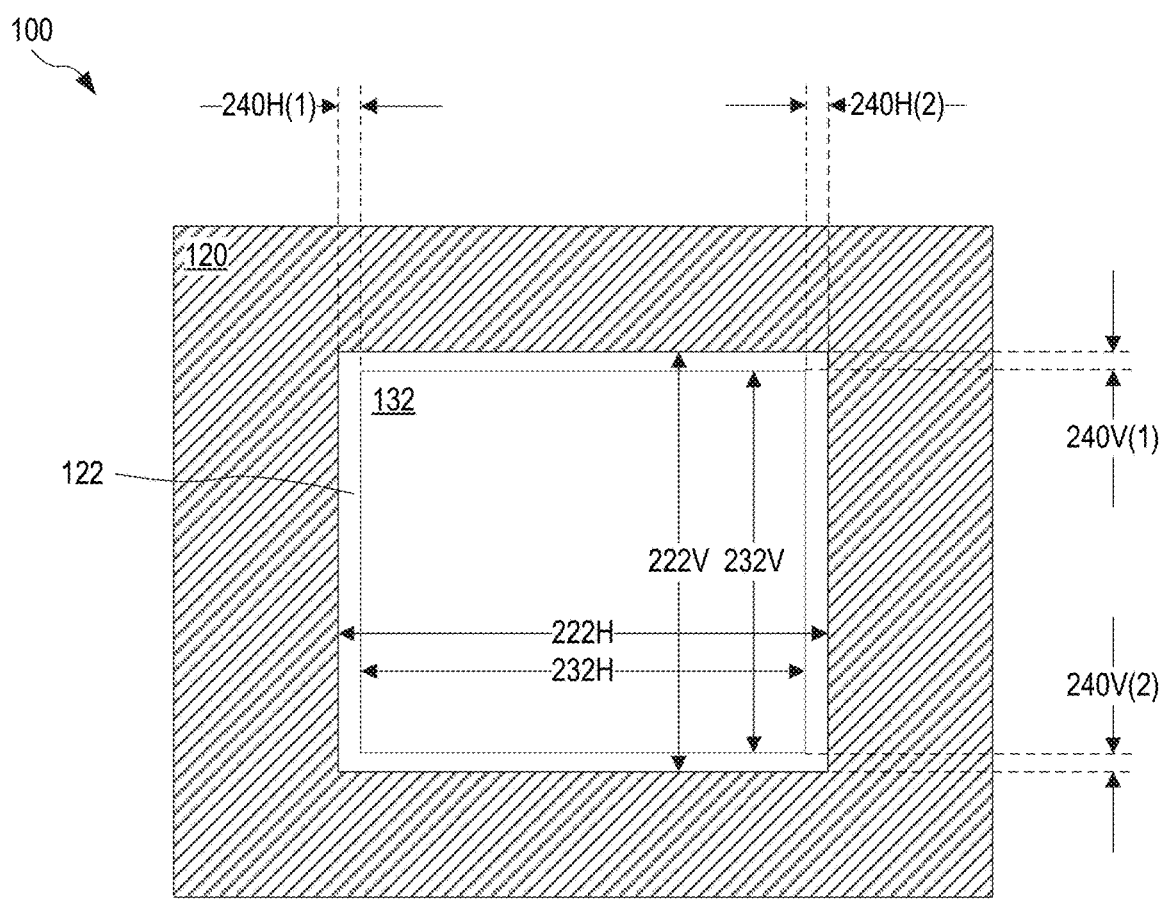

FIGS. 2A and 2B show the configuration of self-aligning lid 130 in further detail. FIG. 2A is a cross-sectional view of device 100. FIG. 2B shows size of inner portion 132 of lid 130 relative to fan-out substrate 120 in dimensions orthogonal to the FIG. 2A cross section. Herein, the dimensions orthogonal to the FIG. 2A cross section are referred to as "transverse dimensions". FIGS. 2A and 2B are best viewed together.

In the examples depicted in FIGS. 1A, 1B, 2A and 2B, each of inner portion 132, aperture 122, and fan-out substrate 120 have rectangular cross section in the dimensions parallel to pixel array 112 (i.e., in dimensions parallel to the plane of FIG. 2B). However, without departing from the scope hereof, the cross section of one or more of inner portion 132, aperture 122, and fan-out substrate 120, in the plane of FIG. 2B, may be non-rectangular. Generally, inner portion 132 may have size and shape that matches the size and shape of aperture 122, or inner portion 132 may be undersized relative to aperture 122. In "tight fit" embodiments where the size and shape of inner portion 132 match the size and shape of aperture 122, inner portion 132 completely registers the position of lid 130 relative to fan-out substrate 120. In such tight-fit embodiments, inner portion 132 ensures that lid 130, and any features thereof (e.g., ports 134), are positioned with high accuracy relative to fan-out substrate 120. When, in addition, fan-out substrate 120 is aligned accurately relative to pixel array 112, these tight-fit embodiments ensure accurate alignment of lid 130 relative to pixel array 112. In "loose-fit" embodiments, inner portion 132 is undersized relative to aperture 122. Alignment accuracy is reduced in such loose-fit embodiments, but insertion of inner portion 132 into aperture 122 may be easier and less affected by manufacturing tolerances, as compared to the tight-fit embodiments.

The following discussion takes basis in the depicted rectangular example, but is readily generalized to non-rectangular cross sections. As shown in FIG. 2B, aperture 122 has extent 222H in a horizontal dimension and extent 222V in a vertical dimension, and inner portion 132 has extent 232H in a horizontal dimension and extent 232V in a vertical dimension. The cross section of FIG. 2A may be in either the horizontal or the vertical dimension. Any difference between extents 222H and 232H may be distributed between gaps 240H(1) and 240H(2). When extents 222H and 232H are the same, gaps 240H(1) and 240H(2) are zero. Similarly, any difference between extents 222V and 232V may be distributed between gaps 240V(1) and 240V(2). When extents 222V and 232V are the same, gaps 240V(1) and 240V(2) are zero. Although not illustrated in FIGS. 2A and 2B, in embodiments where inner portion 132 is smaller than aperture 122, inner portion 132 may be rotated relative to aperture 122 such that each of gaps 240H(1), 240H(2), 240V(1), and 240V(2) are a function of position.

In a first loose-fit embodiment, each of the difference between extents 222H and 232H and the difference between extents 222V and 232V is less than the width 238 of an outer portion 236 of lid 130 flanking inner portion on either side of aperture 122. In this first loose-fit embodiment, the size of inner portion 132 ensures that outer portion 236 overlaps with a material portion of fan-out substrate 120 along the entire perimeter of aperture 122, such that lid 130 may seal fluidic chamber 140 (apart from optional ports 134).

In a second loose-fit embodiment characterized by a tighter fit than the first loose-fit embodiment, each of the difference between extents 222H and 232H and the difference between extents 222V and 232V is less than a certain fraction of the respective one of extents 222H and 222V. The magnitude of this fraction may be set according to desired accuracy of alignment of features of lid 130 relative to, e.g., pixel array 112. In one example, the fraction is 5% or 10%.

In a third loose-fit embodiment also characterized by a tighter fit than the first loose-fit embodiment, each of the difference between extents 222H and 232H and the difference between extents 222V and 232V is sufficient for allowing inner portion 132 to fit in aperture 122 in the presence of expected manufacturing tolerances. For example, each of the difference between extents 222H and 232H and the difference between extents 222V and 232V may be in the range between 20 and 200 microns.

Figure 3:
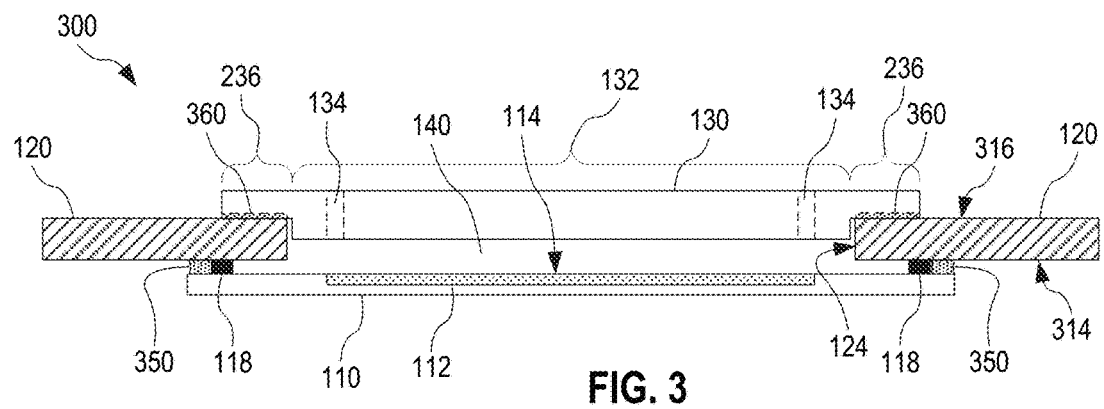
FIG. 3 illustrates a flip-chip sample imaging device, with a self-aligning lid, wherein a fan-out substrate is adhered to an image sensor chip, according to an embodiment.

FIG. 3 illustrates one flip-chip sample imaging device 300, with self-aligning lid 130, wherein fan-out substrate 120 is adhered to image sensor chip 110. Device 300 is an embodiment of device 100 that includes an adhesive 350 at the interface between side 114 of image sensor chip 110 and a surface 314 of fan-out substrate 120 facing side 114. Adhesive 350 surrounds fluidic chamber 140 and helps seal fluidic chamber 140. Adhesive 350 is, for example, a glue.

In one implementation, adhesive 350 is a glue, and the glue is applied after forming electrical connections between electrical contacts 118 and fan-out substrate 120. In this implementation, the glue may be applied to an exposed edge of the interface between side 114 of image sensor chip 110 and surface 314 of fan-out substrate 120. Capillary action may aid the distribution of the glue along the interface.

In certain embodiments, device 300 also includes an adhesive 360 that seals lid 130 to fan-out substrate 120. Adhesive 360 surrounds inner portion 132 of lid 130. In the example depicted in FIG. 3, adhesive 360 is disposed at the interface between outer portion 236 of lid 130 and a surface 316 of fan-out substrate 120 facing away from image sensor chip 110. Without departing from the scope hereof, adhesive 360 may be disposed at the interface between side walls 124 of fan-out substrate 120 and inner portion 132 of lid 130, either in addition to or instead of the location of adhesive 360 shown in FIG. 3. Adhesive 360 is, for example, a glue or a laminated adhesive.

Figure 4:
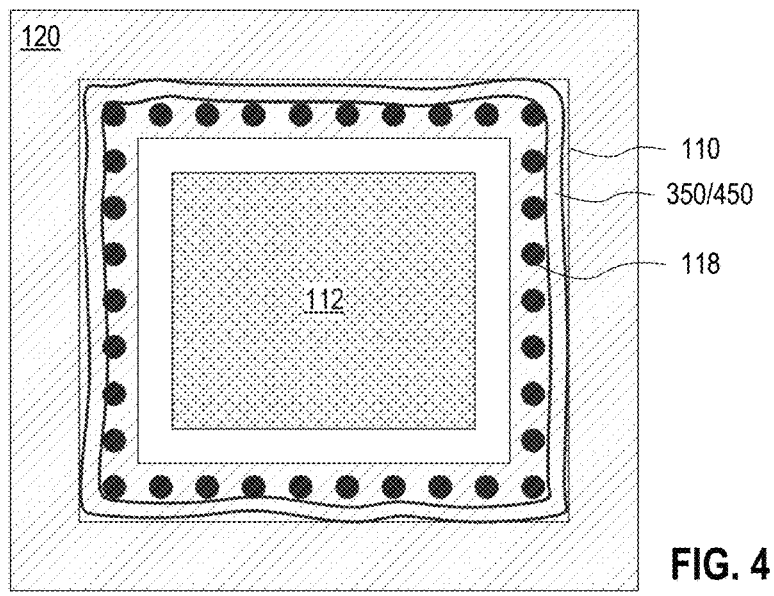
FIG. 4 illustrates one implementation of an adhesive in the device of FIG. 3.

FIG. 4 illustrates one implementation of adhesive 350 in device 300. FIG. 4 shows the positions of fan-out substrate 120 and adhesive 350 projected onto side 114 of image sensor chip 110. Here, adhesive 350 is implemented as a glue layer 450 that surrounds the area collectively occupied by electrical contacts 118. Glue layer 450 may help protect electrical contacts 118 from, e.g., corrosion, caused by exposure to air. Without departing from the scope hereof, glue layer 450 may extend further toward pixel array 112 than shown in FIG. 4 and, for example, extend in between one or more electrical contacts 118.

Figure 5:
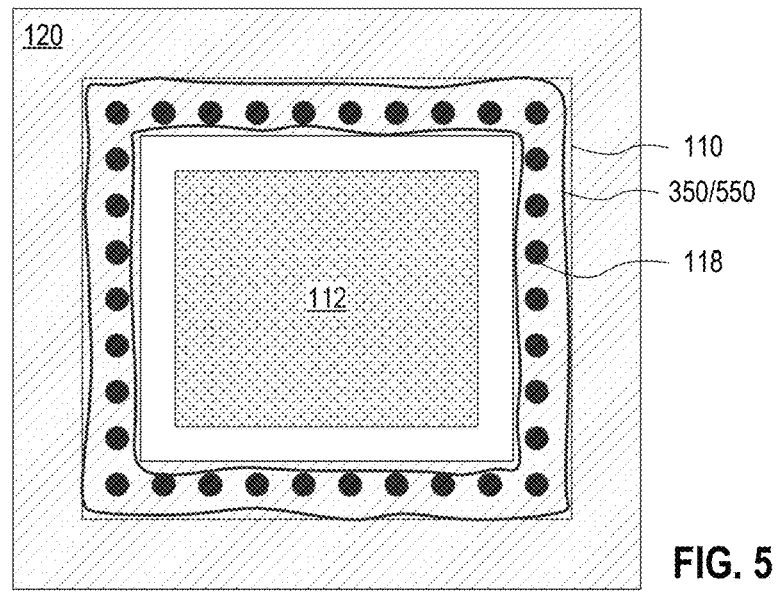
FIG. 5 illustrates another implementation of an adhesive in the device of FIG. 3.

FIG. 5 illustrates another implementation of adhesive 350 in device 300. FIG. 5 shows the positions of fan-out substrate 120 and adhesive 350 projected onto side 114 of image sensor chip 110. Here, adhesive 350 is implemented as a glue layer 550 that not only surrounds the area collectively occupied by electrical contacts 118 but also embeds each electrical contact 118. Glue layer 550 may help protect electrical contacts 118 from both (a) exposure to air from outside device 300 and (b) exposure to sample 180 in fluidic chamber 140. Glue layer 550 may span the entire interface between side 114 of image sensor chip 110 and surface 314 of fan-out substrate 120.

Figure 6:
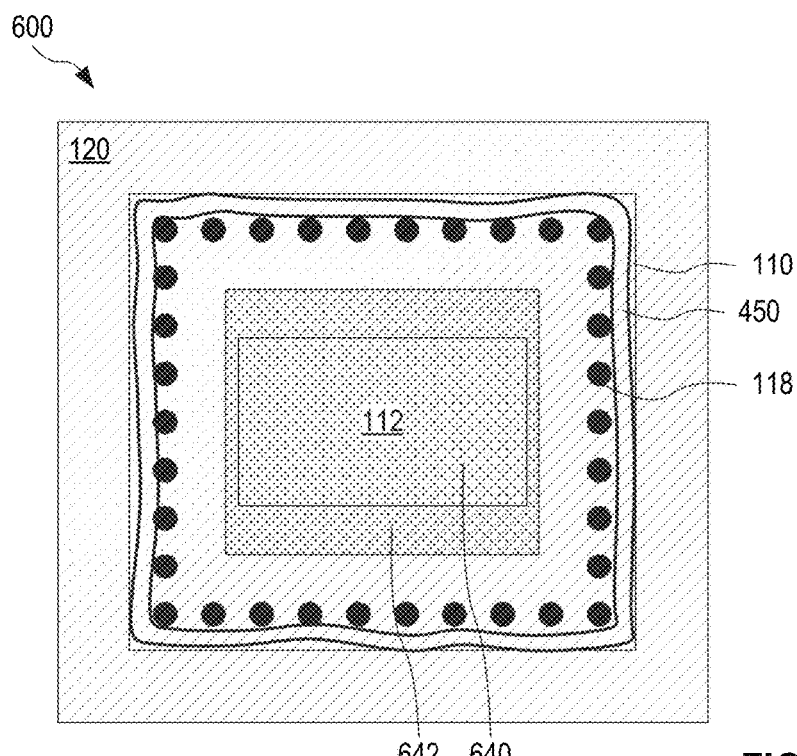
FIG. 6 illustrates a flip-chip sample imaging device, with a self-aligning lid, wherein a fan-out substrate covers a portion of a pixel array of an image sensor chip, according to an embodiment.

FIG. 6 illustrates one flip-chip sample imaging device 600, with self-aligning lid 130, wherein fan-out substrate 120 covers a portion 642 of pixel array 112 of image sensor chip 110, such that only a remaining portion 640 of pixel array 112 is disposed in aperture 122 of fan-out substrate 120. FIG. 6 uses the same view as FIGS. 4 and 5. Device 600 is an embodiment of device 300. Device 600 may implement glue layer 450, as shown in FIG. 6, or implement glue layer 550. When implementing glue layer 550 in device 600, glue layer 550 may span the entire interface between side 114 of image sensor chip 110 and surface 314 of fan-out substrate 120, including portion 642 of pixel array 112.

Figure 7:
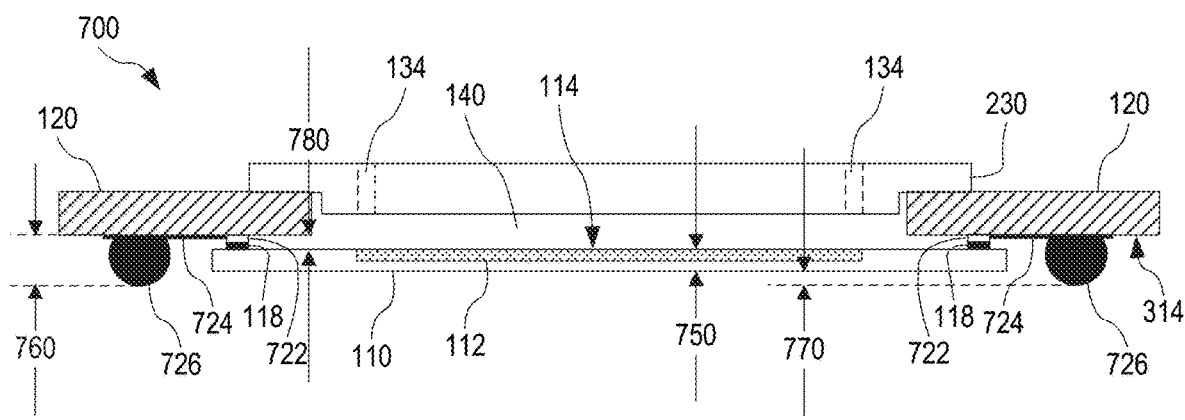
FIG. 7 illustrates a flip-chip sample imaging device that includes a self-aligning lid and electrical contacts and connections that redistribute electrical signals received from an image sensor chip, according to an embodiment.

FIG. 7 illustrates one flip-chip sample imaging device 700 including self-aligning lid 130 and also electrical contacts 722, electrical connections 724, and electrical contacts 726 that redistribute electrical signals received from electrical contacts 118 of image sensor chip 110. Device 700 is an embodiment of 100. Device 700 may form an embodiment of device 300. Electrical contacts 722, electrical connections 724, and electrical contacts 726 are disposed on surface 314 of fan-out substrate 120.

The position of each electrical contact 722 matches the position of a different respective electrical contact 118 on image sensor chip 110. Each pair of electrical contacts 722 and 118 may be connected to each other with solder material (not shown in FIG. 7). This solder material may be composed of or include gold. In one embodiment, one or both of electrical contacts 722 and 118 are pads and may be thinner than indicated in FIG. 7, such that the majority of the gap 780 between side 114 and surface 314 is spanned by solder material. Electrical contacts 726 are located on a portion of fan-out substrate 120 that overhangs image sensor chip 110, such that image sensor chip 110 does not block access to electrical contacts 726. Electrical connections 724 connect electrical contacts 722 to electrical contacts 726. In one embodiment, the number of electrical contacts 722 matches the number of electrical contacts 726, and each electrical contact 722 is connected to a different respective electrical contact 726 via a different respective electrical connection 724. Although FIG. 7 depicts electrical contact 722 as being thicker than electrical connection 724, electrical contact 722 may be a local portion of electrical connection 724 indistinguishable from the rest of electrical connections 724. Each electrical contact 726 may be a solder bump.

In certain embodiments, electrical contacts 726 (e.g., solder bumps) have depth 760 away from surface 314 sufficient to extend beyond the thickness 750 of image sensor chip 110 by a distance 770. In these embodiments electrical contacts 726 may be soldered to electrical contacts/connections on a substrate that spans under the entire device 700 without image sensor chip 110 interfering with such a substrate. In one such embodiment, depth 760 is in the range 200 and 400 microns, gap 780 is in the range between 20 and 40 microns, thickness 750 is in the range between 120 and 200 microns, and distance 770 is in the range between 100 and 200 microns.

Electrical contacts 722 may be soldered to electrical contacts 118 using reflow soldering. The reflow soldering process may serve to self-align fan-out substrate 120 to image sensor chip 110 in the transverse dimensions.

Figure 8:
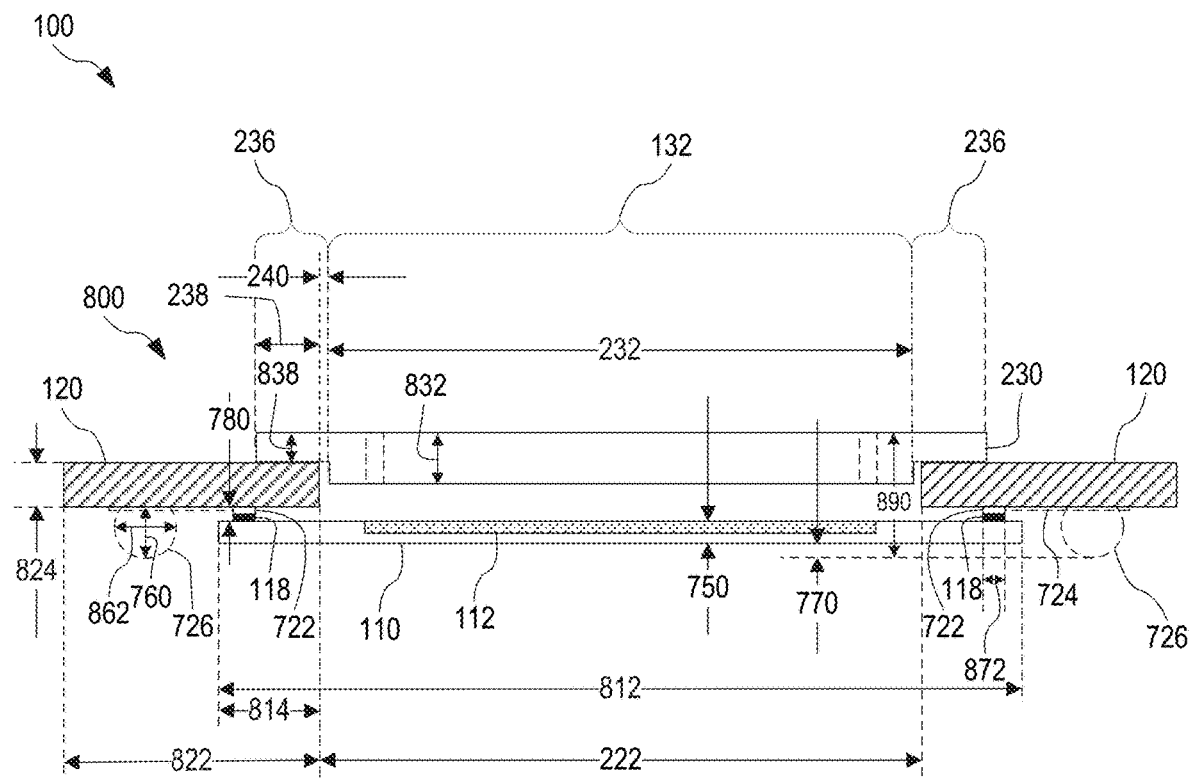
FIG. 8 is a diagram showing example dimensions of several features of embodiments of the device of FIGS. 1A and 1B.

FIG. 8 is a diagram showing example dimensions of several features of embodiments of device 100 discussed above in reference to FIGS. 1-7. In addition to the dimensions already discussed, FIG. 8 indicates a width 812 of image sensor chip 110, a width 814 of an overlap region between image sensor chip 110 and material portions of fan-out substrate 120, a width 822 of material portions of fan-out substrate 120, a thickness 824 of fan-out substrate 120, a thickness 832 of inner portion 132 of lid 130, a thickness 838 of outer portion 236 of lid 130, a width 872 of the electrical connection formed between electrical contacts 118 and 722, a width 826 of electrical contacts 726, and a total package height 890 of one embodiment that implements electrical contacts 726 such distance 770 is greater than zero. Width 812 may be in the range between 3 and 10 millimeters. Width 814 may be in the range between 1 and 2 millimeters. Width 822 may be in the range between 2 and 5 millimeters. Thickness 824 may be in the range between 200 and 400 microns. Thickness 832 may be in the range between 300 and 800 microns. Thickness 838 may be in the range between 100 and 600 microns. Width 872 may be in the range between 50 and 100 microns. Total package height 890 may be in the range between 0.6 and 1.5 millimeters.

Figure 9:
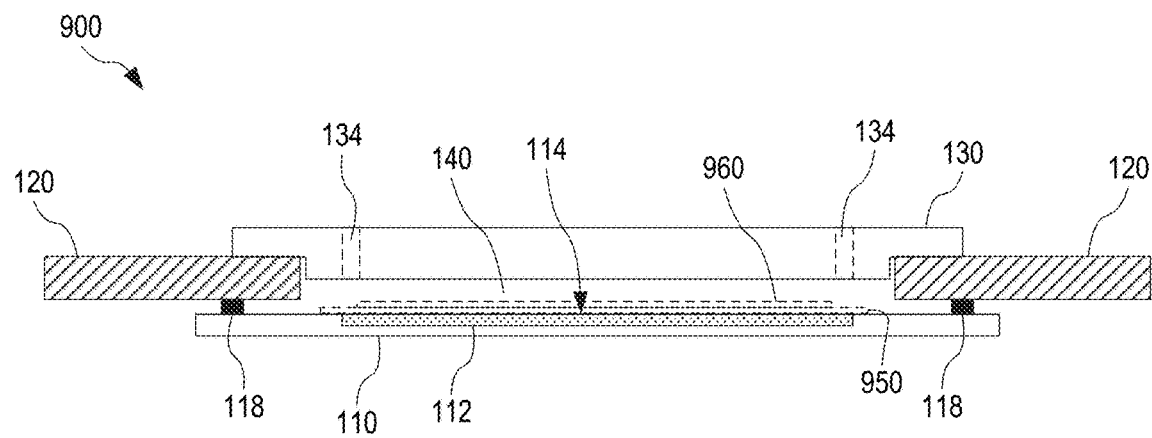
FIG. 9 illustrates a flip-chip sample imaging device that includes a self-aligning lid and one or more layers an image sensor chip, according to an embodiment.

FIG. 9 illustrates one flip-chip sample imaging device 900 including self-aligning lid 130 and one or more additional layers on side 114 of image sensor chip 114. Device 900 is an embodiment of device 100, and may form an embodiment of device 300, 600, or 700. Device 900 includes one or both of an optical layer 950 and an assay layer 960.

Optical layer 950 affects light propagating toward pixel array 112. Optical layer 950 may be an antireflective coating that suppresses light reflections off of side 114. Alternatively, optical layer 950 may be a wavelength filter (e.g., a bandpass filter or a high-pass filter) to suppress imaging of undesired wavelengths, for example to facilitate fluorescence imaging or chemiluminescence imaging of sample 180 or an assay involving sample 180.

Assay layer 960 includes materials that participate in an assay of sample 180. Assay layer 960 may be a continuous layer or a plurality of local spots (such as a microarray).

FIG. 10 illustrates one method 1000 for manufacturing a flip-chip sample imaging device with a self-aligning lid. Method 1000 may be used to manufacture device 100. Method 1000 includes steps 1010, 1020, and 1030.

Step 1010 disposes a fan-out substrate on a first side of an image sensor chip. The image sensor chip includes a pixel array of photosensitive pixels sensitive to light incident on the first side. The fan-out substrate forms an aperture over the pixel array to partly define a chamber for holding a fluidic sample over the pixel array. In one example of step 1010, fan-out substrate 120 is disposed on image sensor chip 110. Step 1010 includes a step 1012. Step 1012 completes electrical connections between first electrical contacts of the image sensor chip and second electrical contacts on a first surface of the fan-out substrate facing the first side. In one example of step 1012, electrical contacts 118 of image sensor chip 110 are soldered to electrical contacts 722 of fan-out substrate 120, for example using reflow soldering. When implementing reflow soldering, step 1012 may serve to self-align fan-out substrate 120 to image sensor chip 110, as discussed above in reference to FIG. 7.

Step 1020 seals the first surface of the fan-out substrate to the first side of the image sensor chip. In one example of step 1020, surface 314 of fan-out substrate 120 is sealed to side 114 of image sensor chip 110. Step 1020 may include a step 1022 of adhering the first surface of the fan-out substrate to the first side of the image sensor chip. In one example of step 1022, adhesive 350 adheres surface 314 of fan-out substrate 120 to side 114 of image sensor chip 110. Step 1022 may include a step 1024 of adding glue to an exposed edge of interface between the first surface and the first side to allow the glue to propagate along the interface via capillary action. In one example of step 1022, adhesive 350, implemented as a glue, is applied to an exposed edge of the interface between side 114 of image sensor chip 110 and surface 314 of fan-out substrate 120, such that the glue propagates along the interface via capillary action, for example to form glue layer 450 or 550.

Step 1030 seals a lid to a second surface of the fan-out substrate facing away from the first side of the image sensor chip, such that an inner portion of the lid protrudes. The protruding inner portion of lid serves to align the lid relative to the fan-out substrate. The protruding inner portion further defines the chamber partly defined by image sensor chip and the fan-out substrate in step 1010. In one example of step 1030, lid 130 is sealed to surface 316 of fan-out substrate 120 such that inner portion 132 protrudes into aperture 122 of fan-out substrate 120. Step 1030 may include steps 1032 and 1034. Step 1032 seats the inner portion of the lid in the aperture of the fan-out substrate to align the lid relative to the fan-out substrate. In one example of step 1032, inner portion 132 of lid 130 is seated in aperture 122 of fan-out substrate 120 to align lid 130 relative to fan-out substrate 120. Step 1034 adheres an outer portion of the lid to the second surface. In one example of step 1034, outer portion 236 of lid 130 is adhered to surface 316 using adhesive 360. Steps 1032 and 1034 may be performed such that a glue (an example of adhesive 360) is applied to either surface 316 of fan-out substrate 120 or outer portion 236 of lid 130 prior to seating inner portion 132 of lid 130 in aperture 122 of fan-out substrate 120. Alternatively, a glue (an example of adhesive 360) may be applied to an edge of the interface between surface 316 of fan-out substrate 120 and outer portion 236 of lid 130 after seating inner portion 132 of lid 130 in aperture 122 of fan-out substrate 120.

Method 1000 may further include a step 1040 of forming, on a portion of the second surface that overhangs the image sensor chip after step 1020, third electrical contacts that are electrically connected to the second electrical contacts via fan-out connections of the fan-out substrate. In one example of step 1040, electrical contacts 726 are formed on a portion of surface 314 that overhangs image sensor chip 110. Although shown in FIG. 10 as being performed after step 1020, step 1040 may be performed before step 1020 or before step 1010, without departing from the scope hereof Combinations of Features Features described above as well as those claimed below may be combined in various ways without departing from the scope hereof. For example, it will be appreciated that aspects of one flip-chip sample imaging device or associated method described herein, may incorporate features or swap features of another fan flip-chip sample imaging device or associated method described herein. The following examples illustrate some possible, non-limiting combinations of embodiments described above. It should be clear that many other changes and modifications may be made to the methods, products, and systems herein without departing from the spirit and scope of this invention:

(A1) A flip-chip sample imaging device with self-aligning lid may include an image sensor chip, a fan-out substrate, and a lid. The image sensor chip includes (a) a pixel array of photosensitive pixels sensitive to light incident on a first side of the image sensor chip and (b) first electrical contacts disposed on the first side and electrically connected to the pixel array. The fan-out substrate (a) is disposed on the first side, (b) is electrically connected to the first electrical contacts, (c) forms an aperture over the pixel array to partly define a chamber for holding a fluid sample over the pixel array, and (d) forms a first surface facing away from the first side. The lid is disposed on the first surface of the fan-out substrate, facing away from the first side, to further define the chamber. The lid includes an inner portion protruding into the aperture to align the lid relative to the fan-out substrate in dimensions parallel to the first side.

(A2) In the flip-chip sample imaging device denoted (A1), the inner portion may be surrounded by an outer portion of the lid, and the outer portion may be coupled to the first surface.

(A3) In the flip-chip sample imaging device denoted as (A2), in each transverse dimension parallel to the first surface, transverse extent of the inner portion may be smaller than transverse extents of the aperture, to ease insertion of the inner portion into the aperture.

(A4) In the flip-chip sample imaging device denoted as (A3), in each transverse dimension parallel to the first surface, difference between the transverse extent of the inner portion and the transverse extent of the aperture may be less than minimum width of the outer portion in the dimension, to ensure overlap between the outer portion and the first surface along entire perimeter of the aperture.

(A5) In either of the flip-chip sample imaging devices denoted as (A3) and (A4), in each transverse dimension parallel to the first surface, difference between the transverse extent of the inner portion and the transverse extent of the aperture may be less than 10 percent of the transverse extent of the aperture.

(A6) In any of the flip-chip sample imaging devices denoted as (A3) through (A5), in each transverse dimension parallel to the first surface, difference between the transverse extent of the inner portion and the transverse extent of the aperture may be in the range between 20 and 200 microns.

(A7) In any of the flip-chip sample imaging devices denoted as (A1) through (A6), the fan-out substrate may include, on a second surface of the fan-out substrate opposite-facing to the first surface, second electrical contacts in contact with the first electrical contacts, and fan-out connections electrically connecting the second electrical contacts to third electrical contacts disposed on a portion of the second surface overhanging the image sensor chip.

(A8) In the flip-chip sample imaging device denoted as (A7), depth of the third electrical contacts away from the second surface, in a first dimension orthogonal to the second surface, may extend past thickness of the image sensor chip in the first dimension.

(A9) Either of the flip-chip sample imaging devices denoted as (A7) and (A8) may further include an adhesive at interface between the first side and the second surface, to seal the fan-out substrate to the image sensor chip.

(A10) In the flip-chip sample imaging device denoted as (A9), the adhesive may enclose the first electrical contacts, the second electrical contacts, and electrical connections therebetween (A11) In any of the flip-chip sample imaging devices denoted as (A1) through (A10), the pixel array may be entirely inside the aperture.

(A12) In any of the flip-chip sample imaging devices denoted as (A1) through (A10), a first portion of the pixel array being inside the aperture, a second portion of the pixel array being covered by a material portion of the fan-out substrate.

(A13) Any of the flip-chip sample imaging devices denoted as (A1) through (A12) may further include an adhesive between the lid and the fan-out substrate, to seal the lid to the fan-out substrate.

(A14) In any of the flip-chip sample imaging devices denoted as (A1) through (A13), the lid may form at least two ports to enable sample flow at least into the chamber.

(B1) A method for manufacturing a flip-chip sample imaging device with self-aligning lid may include (a) disposing a fan-out substrate on a first side of an image sensor chip including a pixel array of photosensitive pixels sensitive to light incident on the first side, wherein (i) the fan-out substrates forming an aperture over the pixel array partly defining a chamber for holding a fluidic sample over the pixel array, and (ii) the step of disposing includes completing electrical connections between first electrical contacts of the image sensor chip and second electrical contacts on a first surface of the fan-out substrate facing the first side, (b) sealing the first surface to the first side, and (c) sealing a lid to a second surface of the fan-out substrate facing away from the first side, such that an inner portion of the lid protrudes into the aperture to (a) align the lid relative to the fan-out substrate and (b) further define the chamber.

(B2) In the method denoted as (B1), the step of sealing the lid to the second surface may include seating the inner portion in the aperture to align the lid relative to the fan-out substrate, and adhering an outer portion of the lid to the second surface.

(B3) In either of the methods denoted as (B1) and (B2), the step of sealing the first surface to the first side may include adhering the first surface to the first side.

(B4) In the method denoted as (B3), the step of adhering the first surface to the first side may include, after the step of completing the electrical connections, adding glue to an exposed edge of interface between the first surface and the first side to allow the glue to propagate along the interface via capillary action.

(B5) Any of the methods denoted as (B1) through (B4) may further include forming, on a portion of the first surface that overhangs the image sensor chip after the step of sealing the first surface, third electrical contacts having depth away from the first surface, in a first dimension orthogonal to the first surface, that extends past thickness of the image sensor chip in the first dimension after the step of sealing the first surface, wherein the third electrical contacts are electrically connected to the second electrical contacts via fan-out connections of the fan-out substrate.

Changes may be made in the above systems and methods without departing from the scope hereof. It should thus be noted that the matter contained in the above description and shown in the accompanying drawings should be interpreted as illustrative and not in a limiting sense. The following claims are intended to cover generic and specific features described herein, as well as all statements of the scope of the present systems and methods, which, as a matter of language, might be said to fall therebetween.

What is claimed is:

1. A flip-chip sample imaging device with self-aligning lid, comprising:
    an image sensor chip including (a) a pixel array of photosensitive pixels sensitive to light incident on a first side of the image sensor chip and (b) first electrical contacts disposed on the first side and electrically connected to the pixel array;
    a fan-out substrate (a) disposed on the first side, (b) electrically connected to the first electrical contacts, (c) forming an aperture over the pixel array to partly define a chamber for holding a fluid sample over the pixel array, and (d) forming a first surface facing away from the first side; and
    a lid disposed on the first surface of the fan-out substrate, facing away from the first side, to further define the chamber, the lid including an inner portion protruding into the aperture to align the lid relative to the fan-out substrate in dimensions parallel to the first side.

2. The flip-chip sample imaging device of claim 1, the inner portion being surrounded by an outer portion of the lid, the outer portion being coupled to the first surface.

3. The flip-chip sample imaging device of claim 2, in each transverse dimension parallel to the first surface, transverse extent of the inner portion being smaller than transverse extents of the aperture, to ease insertion of the inner portion into the aperture.

4. The flip-chip sample imaging device of claim 3, in each transverse dimension parallel to the first surface, difference between the transverse extent of the inner portion and the transverse extent of the aperture being less than minimum width of the outer portion in the dimension, to ensure overlap between the outer portion and the first surface along entire perimeter of the aperture.

5. The flip-chip sample imaging device of claim 3, in each transverse dimension parallel to the first surface, difference between the transverse extent of the inner portion and the transverse extent of the aperture being less than 10 percent of the transverse extent of the aperture.

6. The flip-chip sample imaging device of claim 3, in each transverse dimension parallel to the first surface, difference between the transverse extent of the inner portion and the transverse extent of the aperture being in range between 20 and 200 microns.

7. The flip-chip sample imaging device of claim 1, the fan-out substrate including, on a second surface of the fan-out substrate opposite-facing to the first surface, second electrical contacts in contact with the first electrical contacts, and fan-out connections electrically connecting the second electrical contacts to third electrical contacts disposed on a portion of the second surface overhanging the image sensor chip.

8. The flip-chip sample imaging device of claim 7, depth of the third electrical contacts away from the second surface, in a first dimension orthogonal to the second surface, extending past thickness of the image sensor chip in the first dimension.

9. The flip-chip sample imaging device of claim 1, further comprising an adhesive at interface between the first side and the second surface, to seal the fan-out substrate to the image sensor chip.

10. The flip-chip sample imaging device of claim 9, the adhesive enclosing the first electrical contacts, the second electrical contacts, and the contacts therebetween.

11. The flip-chip sample imaging device of claim 1, the pixel array being entirely inside the aperture.

12. The flip-chip sample imaging device of claim 1, a first portion of the pixel array being inside the aperture, a second portion of the pixel array being covered by a material portion of the fan-out substrate.

13. The flip-chip sample imaging device of claim 1, further comprising an adhesive between the lid and the fan-out substrate, to seal the lid to the fan-out substrate.

14. The flip-chip sample imaging device of claim 1, the lid forming at least two ports to enable sample flow at least into the chamber.

15. A method for manufacturing a flip-chip sample imaging device with self-aligning lid, comprising:
disposing a fan-out substrate on a first side of an image sensor chip including a pixel array of photosensitive pixels sensitive to light incident on the first side, the fan-out substrate forming an aperture over the pixel array partly defining a chamber for holding a fluidic sample over the pixel array, said disposing including completing electrical connections between first electrical contacts of the image sensor chip and second electrical contacts on a first surface of the fan-out substrate facing the first side;
sealing the first surface to the first side; and
sealing a lid to a second surface of the fan-out substrate facing away from the first side, such that an inner portion of the lid protrudes into the aperture to (a) align the lid relative to the fan-out substrate and (b) further define the chamber.

16. The method of claim 15, the step of sealing the lid to the second surface comprising:
seating the inner portion in the aperture to align the lid relative to the fan-out substrate; and
adhering an outer portion of the lid to the second surface.

17. The method of claim 15, the step of sealing the first surface to the first side comprising adhering the first surface to the first side.

18. The method of claim 17, the step of adhering the first surface to the first side comprising:
after the step of completing the electrical connections, adding glue to an exposed edge of interface between the first surface and the first side to allow the glue to propagate along the interface via capillary action.

19. The method of claim 15, further comprising forming, on a portion of the first surface that overhangs the image sensor chip after the step of sealing the first surface, third electrical contacts having depth away from the first surface, in a first dimension orthogonal to the first surface, that extends past thickness of the image sensor chip in the first dimension after the step of sealing the first surface, the third electrical contacts being electrically connected to the second electrical contacts via fan-out connections of the fan-out substrate.

* * * * *